United States Patent
Regensburger et al.

(10) Patent No.: US 11,614,215 B2
(45) Date of Patent: Mar. 28, 2023

(54) LIGHTING DEVICE

(71) Applicant: OSRAM OLED GMBH, Regensburg (DE)

(72) Inventors: Robert Regensburger, Kallmünz (DE); Stefan Groetsch, Bad Abbach (DE); Ulrich Frei, Regensburg (DE); Peter Brick, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 17/266,282

(22) PCT Filed: Aug. 2, 2019

(86) PCT No.: PCT/EP2019/070899
§ 371 (c)(1),
(2) Date: Feb. 5, 2021

(87) PCT Pub. No.: WO2020/030550
PCT Pub. Date: Feb. 13, 2020

(65) Prior Publication Data
US 2021/0301997 A1    Sep. 30, 2021

(30) Foreign Application Priority Data
Aug. 8, 2018  (DE) .............. 10 2018 119 312.2

(51) Int. Cl.
*F21S 41/663* (2018.01)
*F21S 41/25* (2018.01)
*F21S 41/143* (2018.01)
*F21S 41/153* (2018.01)
*H01L 25/075* (2006.01)
(Continued)

(52) U.S. Cl.
CPC .......... *F21S 41/663* (2018.01); *F21S 41/143* (2018.01); *F21S 41/153* (2018.01); *F21S 41/25* (2018.01); *H01L 25/0753* (2013.01); *B60Q 1/1423* (2013.01); *F21Y 2105/10* (2016.08); *F21Y 2115/10* (2016.08)

(58) Field of Classification Search
CPC ................ F21S 41/25; F21S 41/143
See application file for complete search history.

(56) References Cited

U.S. PATENT DOCUMENTS 10,066,799 B2 * 9/2018 Bhakta .............. F21S 41/675
2004/0114921 A1 * 6/2004 Braun .................. G01S 17/89
396/661

(Continued)

FOREIGN PATENT DOCUMENTS

DE  10 2011 102 032 A1  11/2012
DE  10 2012 008 833 A1  11/2012
(Continued)

OTHER PUBLICATIONS

Machine Translation of Gottfried (DE 102016103649 A1) (Year: 2016).*

(Continued)

*Primary Examiner* — Andrew J Coughlin
(74) *Attorney, Agent, or Firm* — Hauptman Ham, LLP

(57) ABSTRACT

A lighting device includes a pixel array of light-emitting pixels arranged next to one another. The pixel array includes light-emitting pixels with different pixel shapes.

19 Claims, 8 Drawing Sheets

(51) Int. Cl.
  *F21Y 105/10*  (2016.01)
  *F21Y 115/10*  (2016.01)
  *B60Q 1/14*  (2006.01)

(56) References Cited

U.S. PATENT DOCUMENTS

2019/0116345 A1* 4/2019 Albou .................. F21S 41/675
2019/0145598 A1* 5/2019 Gammer ................ F21S 41/16
                                                                362/517

FOREIGN PATENT DOCUMENTS

| DE | 10 2016 100 351 A1 | 7/2017 |
| DE | 10 2016 103 649 A1 | 9/2017 |
| EP | 3 026 705 A1 | 6/2016 |
| WO | 2018/002252 A1 | 1/2018 |

OTHER PUBLICATIONS

International Search Report issued in corresponding International Patent Application No. PCT/EP2019/070899 dated Oct. 22, 2019, along with an English translation.
Written Opinion ssued in corresponding International Patent Application No. PCT/EP2019/070899 dated Oct. 22, 2019.

* cited by examiner

LIGHTING DEVICE

CROSS REFERENCE TO RELATED APPLICATION

This application is a National Stage of International Application No. PCT/EP2019/070899, filed on Aug. 2, 2019, which designates the United States and was published in Europe, and which claims priority to German Patent Application No. 10 2018 119 312.2, filed on Aug. 8, 2018, in the German Patent Office. Both of the aforementioned applications are hereby incorporated by reference in their entireties.

The present invention relates to a lighting device comprising light-emitting pixels arranged next to one another.

Lighting devices are known which comprise a light source with a pixel array consisting of light-emitting pixels arranged next to one another. A possible example is a headlight of an adaptive front-lighting system (AFS), used in the automotive sector. In this case a pixelated light-emitting semiconductor chip (µAFS, micro-structured adaptive front-lighting system) can be used.

The object of the present invention is to specify an improved lighting device comprising light-emitting pixels arranged next to one another.

This object is achieved by a lighting device according to claim 1. Further advantageous embodiments of the invention are specified in the dependent claims.

According to one aspect of the invention, a lighting device comprising a pixel array of light-emitting pixels arranged next to one another is proposed. The pixel array comprises light-emitting pixels with different pixel shapes.

The proposed lighting device comprises a pixel array of light-emitting pixels with different pixel shapes. In this context, different outline shapes of pixels and/or different sizes of pixels may be present, in a plan view of the pixel array. With reference to the first variant, pixels of different geometric shapes, such as different polygon shapes, may be present. This includes, for example, a configuration in which pixels with different quadrangular shapes are present. With reference to the second variant, pixels with different dimensions, i.e. lateral dimensions or areal dimensions, can be present.

The proposed lighting device offers a number of advantages. For example, the pixel array of the lighting device can be designed such that the light radiation emitted by the pixel array during operation is optically imaged in such a way that an optical image of the pixel array with a geometric shape that is not distorted, or distorted as little as possible, is generated in an illumination region. Furthermore, the pixel array of the lighting device can be implemented with a small total pixel surface area and/or with a small number of pixels. This can prove to be cost-effective.

In the following, further possible details and embodiments are described which can be considered for the lighting device.

In a possible embodiment, the lighting device is a headlamp or a component of a headlamp. The headlamp can be used in an adaptive front-lighting system (AFS).

In another embodiment, the light-emitting pixels of the pixel array are arranged next to each other in a matrix-like manner in the form of rows and columns.

In another embodiment, the light-emitting pixels of the pixel array can be driven separately from each other. In this way, the pixels can be operated individually and independently of each other for the emission of a light radiation. This allows the possibility of a flexible adjustment in relation to the lighting of an illumination region.

The light radiation emitted by the pixel array during operation can be optically imaged as indicated above. For this purpose, according to a further embodiment it is provided that the lighting device comprises an imaging optics arranged downstream of the pixel array for optically imaging a light radiation generated by means of the pixel array. The imaging optics can be used to generate optical images of the pixel array and the light-emitting pixels in an illumination region (far field). The imaging optics can be, for example, a lens or a reflector, or may comprise one or more of the aforementioned components.

The optical imaging using the imaging optics can be accompanied by a distortion. Despite this effect, it is possible for the light radiation emitted by the pixel array to be optically imaged in such a way that an optical image of the pixel array with a geometric shape that is not distorted, or distorted as little as possible, is generated in an illumination region. This can be implemented as follows.

In a further embodiment, the pixel array and the light-emitting pixels comprise quadrangular shapes. The pixel array also comprises a shape deviating from a rectangular shape and comprises pixels which comprise shapes deviating from a rectangular shape. By means of the imaging optics, an optical distortion can be effected. In this way, optical images of the pixel array and of the light-emitting pixels can be generated in an illumination region, which images comprise rectangular shapes or which, in contrast to the pixel array and to the light-emitting pixels, comprise shapes deviating to a lesser extent from a rectangular shape. It is also possible that the optical images comprise square shapes or, in contrast to the pixel array or to the light-emitting pixels, shapes deviating from a square shape to a lesser extent.

With reference to the above-mentioned embodiment, the deviation from a rectangular shape in the pixel array can be defined as follows. For the pixel array and the light-emitting pixels comprising a shape deviating from a rectangular shape, maximal approximate rectangular reference areas can be considered, which in plan view are comprised by the pixel array and the relevant pixels and which extend up to the edge of the pixel array and the pixels. The total surface areas of the pixel array and of the pixels as a proportion of the surface areas of the respective approximate reference areas can be no greater than a specified deviation value. For example, the deviation value can be 30%. A deviation value of 10% or 100%, for example, is also possible.

The pixel array can comprise light-emitting pixels which deviate from a rectangular shape by different degrees. The pixels located at the edge or in the corners of the pixel array may deviate the most from a rectangular shape. Similarly, such pixels may comprise the largest proportional surface area differences with respect to the corresponding rectangular reference areas.

The feature that optical images of the pixel array and of the light-emitting pixels comprise shapes deviating from a rectangular shape to a lesser extent than the pixel array and the light-emitting pixels can be explained in a similar way using reference areas. For this purpose, maximal approximate rectangular reference areas can also be considered for the optically imaged pixel array and the optically imaged pixels that comprise a shape deviating from a rectangular shape, which areas in plan view are comprised by the imaged pixel array and the relevant imaged pixels, and which extend up to the edge of the imaged pixel array and the imaged pixels. With reference to the feature "deviating to a lesser extent", the proportional surface area differences between the imaged pixel array or the imaged pixels and their respective associated rectangular reference areas may be less than the proportional area differences between the pixel array or pixels and the respective associated reference areas.

With reference to the above-mentioned embodiment, the pixel array can additionally comprise a geometric shape with a distorted structure, wherein the distorted structure and the optical distortion effected by the imaging optics counteract each other. This makes it possible, at least in part, to introduce a geometric compensation of the distortion that occurs due to the optical imaging. In this context, the following configurations may also be considered.

In a further embodiment, the pixel array and the light-emitting pixels comprise quadrangular shapes. The pixel array comprises a distorted structure in such a manner that the pixel array comprises outwardly curved sides and, towards the edge of the pixel array, light-emitting pixels comprising shapes increasingly deviating from a rectangular or square shape. This property can be present starting from the center of the pixel array, or starting from the center of the pixel array and moving from one pixel to the respectively adjacent pixel.

Such distorted light-emitting pixels may comprise curved sides, and may comprise trapezoidal or diamond-like shapes. Despite the distorted structure of the pixel array, the light-emitting pixels may comprise matching or substantially matching dimensions. Non-light-emitting intermediate regions forming a line grid may also be present between the light-emitting pixels of the pixel array. Due to the distorted structure of the pixel array, the lines of the line grid may comprise increasingly greater curvatures in the direction of the edge of the pixel array.

The above-mentioned feature, that there are light-emitting pixels comprising shapes deviating increasingly from a rectangular shape in the direction of the edge of the pixel array, can be similarly explained using reference areas. For this purpose, for the light-emitting pixels comprising a shape deviating from a rectangular shape, maximal approximate rectangular reference areas can be considered, which in plan view are comprised by the pixels and which extend up to the edge of the pixels. In the direction of the edge of the pixel array, the proportional area differences between the pixels and their associated reference areas can become increasingly larger.

With regard to the distorted structure of the pixel array, it is possible that this corresponds to a barrel-shaped distortion of a rectangular grid. The line grid formed by the intermediate regions can comprise the shape of a barrel-shaped distorted grid in a similar manner.

In a further embodiment, the lighting device comprises an imaging optics arranged downstream of the distorted pixel array for optically imaging a light radiation generated by means of the pixel array. By means of the imaging optics, an optical distortion can be effected, which is oriented opposite to the distorted structure. This allows optical images of the pixel array and of the light-emitting pixels to be generated in an illumination region, which images are at least less distorted compared to the pixel array and the light-emitting pixels. In this case, the optical images can comprise rectangular shapes or shapes deviating less from a rectangular shape in contrast to the pixel array and to the light-emitting pixels. It is also possible that the optical images comprise square shapes or, in contrast to the pixel array or to the light-emitting pixels, shapes deviating from a square shape to a lesser extent.

In a further embodiment, a pincushion-shaped distortion can be effected by means of the imaging optics. In this way, the above-mentioned distorted structure of the pixel array, which can correspond to a barrel-shaped distortion, can be counteracted with a high degree of reliability and effectiveness.

In a further embodiment the imaging optics is configured in such a way that optical images of the light-emitting pixels are present in the illumination region that comprise increasingly larger dimensions towards the edge of the optically imaged pixel array. This characteristic can apply starting from the center of the optically imaged pixel array outwards. The light-emitting pixels, on the other hand, can comprise matching or essentially matching dimensions in spite of the distorted structure of the pixel array. In this way, it is possible to illuminate a large illumination region. In conjunction with a design of the lighting device with separately controllable light-emitting pixels, it is also possible to provide different light distributions with a high spatial resolution in the central part of the illumination region. On the other hand, light distributions with a lower or coarser resolution can be provided further out from the center. Such a configuration, which can be implemented with a cost-effective design of the lighting device with a small number of light-emitting pixels and/or a small pixel area, can be suitable, for example, for a headlamp application of the lighting device. This is because for different light distributions, a high resolution may only be required in the center of the illumination region.

Alternatively, the imaging optics can be configured in such a way that the optical images of the light-emitting pixels comprise matching dimensions in the illumination region.

With regard to the lighting device, variants without a distorted structure of the pixel array can also be considered. The following embodiments are then conceivable.

In a further embodiment, the pixel array and the light-emitting pixels comprise rectangular shapes. In addition, the light-emitting pixels comprise increasingly larger dimensions towards the edge of the pixel array. This property can apply starting from the center of the pixel array, or starting from the center of the pixel array and moving from one pixel to the respectively adjacent pixel.

The above-mentioned embodiment may include designs in which the pixel array and/or pixels of the pixel array comprise square shapes. In this context, it is possible, for example, that square light-emitting pixels are present in the center and along the diagonals of the rectangular or square pixel array. Elsewhere, non-square rectangular pixels may be present. There may also be different distances between the centers of the pixels. The distances between the centers can increase in size from the center of the pixel array towards the edge of the pixel array. Non-light-emitting intermediate regions forming a line grid may also be present between the light-emitting pixels of the pixel array. The line grid can be a right-angled grid.

The embodiment described above may also be considered in relation to a headlamp application of the lighting device. The lighting device can have an inexpensive design with a small number of light-emitting pixels and/or a small pixel surface area.

In a further embodiment that may be considered in this context, the lighting device comprises an imaging optics arranged downstream of the rectangular pixel array for optically imaging a light radiation generated by means of the pixel array. By means of the imaging optics, optical images of the pixel array and of the light-emitting pixels can be generated in an illumination region, in such a way that optical images of the light-emitting pixels are present comprising increasingly larger dimensions towards the edge of the optically imaged pixel array. This characteristic can apply starting from the center of the optically imaged pixel array outwards. In this way, it is possible to illuminate a large illumination region. In conjunction with a design of the lighting device with separately controllable light-emitting pixels, it is also possible to provide different light distributions with a high spatial resolution in the central part of the illumination region. On the other hand, light distributions with a lower or coarser resolution can be provided further out from the center. This structure can satisfy requirements on a headlamp application of the lighting device.

In a further embodiment, the optical images of the rectangular pixel array and of the rectangular light-emitting pixels that can be generated in the illumination region by means of the imaging optics comprise rectangular shapes. In this case a portion of the optical images can comprise a square shape. The imaging optics used in this embodiment is configured to image the pixel array optically in a distortion-free manner, i.e. without causing any distortion.

Alternatively, an imaging optics that effects a distortion can be used. In this way, the optical images of the rectangular pixel array and the rectangular light-emitting pixels, which can be generated in the illumination region using the imaging optics, can comprise shapes deviating from a rectangular shape. In this case it may be desirable to use only a slightly distorting imaging optics, with the result that the optical images deviate only slightly from a rectangular shape.

The feature that optical images of the rectangular pixel array and the rectangular light-emitting pixels comprise shapes deviating from a rectangular shape can also be defined using reference areas. For this purpose, maximal approximate rectangular reference areas can also be considered for the optically imaged pixel array and the optically imaged pixels that comprise a shape deviating from a rectangular shape, which areas in plan view are comprised by the imaged pixel array and the relevant imaged pixels and which extend up to the edge of the imaged pixel array and the imaged pixels. The total surface areas of the imaged pixel array and of the imaged pixels as a proportion of the surface areas of the respective reference areas can be no greater than a specified deviation value. For example, the deviation value can be 30%. A deviation value of 10% or 100%, for example, is also possible.

In a further embodiment, the lighting device comprises a pixelated light-emitting semiconductor chip, by means of which the pixel array of the light-emitting pixels is formed. The semiconductor chip can be realized in the form of a pixelated LED chip (light emitting diode). The pixelated light-emitting semiconductor chip can also be configured in the form of a flip-chip.

The pixelated light-emitting semiconductor chip can comprise a semiconductor layer sequence or a semiconductor body with light-emitting regions arranged next to one another. The light-emitting regions may be separated by a trench structure, if necessary. The light-emitting regions can be configured to generate a primary light radiation. The semiconductor chip can comprise a conversion layer arranged on the semiconductor layer sequence or the semiconductor body, with which the primary light radiation can be partially converted into a secondary light radiation. In operation, a mixed radiation comprising the primary and the secondary light radiation can be emitted. The primary and secondary light radiation can be a blue and a yellow light radiation, so that overall a white light radiation can be emitted.

The light-emitting pixels of the pixel array can each be formed by a light-emitting region of the semiconductor layer sequence or semiconductor body and a region of the conversion layer through which light is transmitted during operation of the relevant light-emitting region. The geometric shape of the pixel array and the light-emitting pixels can be determined by the lateral geometric shape of the light-emitting regions.

The pixelated light-emitting semiconductor chip can also comprise a contact structure with contact elements. The contact structure can be formed on a side of the light-emitting semiconductor chip designated for mounting. The contact elements can be used to contact the semiconductor chip and electrically drive the light-emitting regions separately from one another.

In a further embodiment, the lighting device comprises an electronic semiconductor chip on which the pixelated light-emitting semiconductor chip is arranged. The electronic semiconductor chip is configured to drive the light-emitting pixels of the pixel array. The electronic semiconductor chip can comprise a contact structure with contact elements, which are connected to contact elements of a contact structure of the pixelated light-emitting semiconductor chip via an electrically conductive connecting material. The electronic semiconductor chip can also comprise a plurality of switches, via which the light-emitting regions of the pixelated light-emitting semiconductor chip, and hence the light-emitting pixels of the pixel array, can be driven. The switches can be realized in the form of transistors.

In a further embodiment, the pixelated light-emitting semiconductor chip and the electronic semiconductor chip comprise contact structures that are electrically interconnected. As indicated above, the contact structures can comprise matched contact elements that are electrically connected to each other via an electrically conductive connecting material. It is also provided that the contact structure of the pixelated light-emitting semiconductor chip and/or the contact structure of the electronic semiconductor chip comprises at least one redistribution layer. By means of the at least one redistribution layer, it is possible to compensate for an offset which may be introduced by the different pixel shapes of the light-emitting pixels and hence the light-emitting regions of the pixelated light-emitting semiconductor chip. In this way, a reliable electrical connection can be produced between the pixelated light-emitting semiconductor chip and the electronic semiconductor chip.

The advantageous designs and extensions of the invention described above and/or reproduced in the subclaims can be applied individually or else in any combination with each other—except, for example, in cases of clear dependencies or incompatible alternatives.

The properties, features and advantages of the present invention described above and the manner in which these are achieved, will become clearer and more comprehensible in conjunction with the following description of exemplary embodiments, which are explained in more detail in connection with the drawings. In the drawings.

The following schematic figures will be used to describe possible designs of a lighting device comprising a pixel array consisting of light-emitting pixels. In a plan view of the pixel array, the pixel array comprises light-emitting pixels with different pixel shapes. Different contours of pixels and/or different sizes of pixels can be provided. It should also be noted that the schematic figures may not be drawn true to scale. Therefore, components and structures shown in the figures may be shown exaggerated or reduced in size to allow a better understanding.

Figure 1:
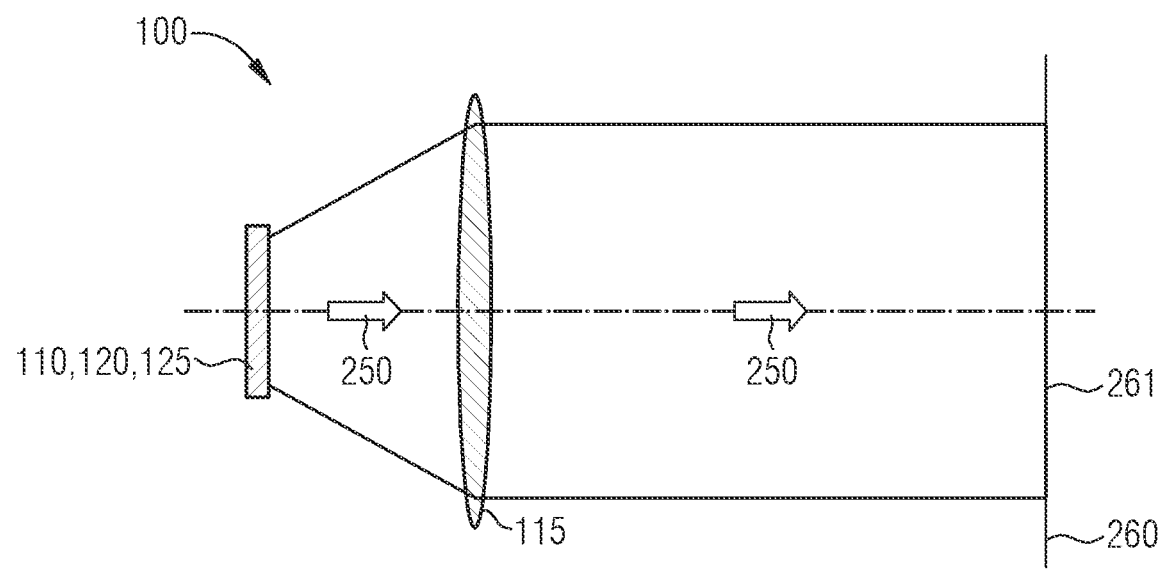
FIG. 1 shows a lighting device comprising a light source and an imaging optics.

FIG. 1 shows a schematic illustration of a lighting device 100. The lighting device 100 comprises a pixelated light source 110 and an imaging optics 115 arranged downstream of the light source 110. The light source 110 is configured to generate a light radiation 250. As explained in more detail using additional figures below, the light source 110 comprises a pixel array 120, 125 for this purpose, consisting of separately controllable light-emitting pixels 127. By means of the imaging optics 115, the light radiation 250 coming from the light source 110 can be shaped and optically imaged in an illumination plane 260 at a distance from the imaging optics 115. In this way, a target region, in the following also referred to as the illumination region 261, can be illuminated in the illumination plane 260 (far field).

For example, the lighting device 100 shown in FIG. 1 can be a headlamp of an adaptive lighting system used in the automotive sector. In relation to this application, the light radiation 250 emitted by the light source 110 can be a white light radiation. In addition, the illumination region 261 can be an area located in front of a vehicle (not shown in either case).

The imaging optics 115, as indicated in FIG. 1, can be a lens. Alternatively, the imaging optics 115 can be realized in a different design, for example in the form of a reflector. It is also possible that the imaging optics 115 comprises one or more of the aforementioned components (not shown in each case).

Figure 2:
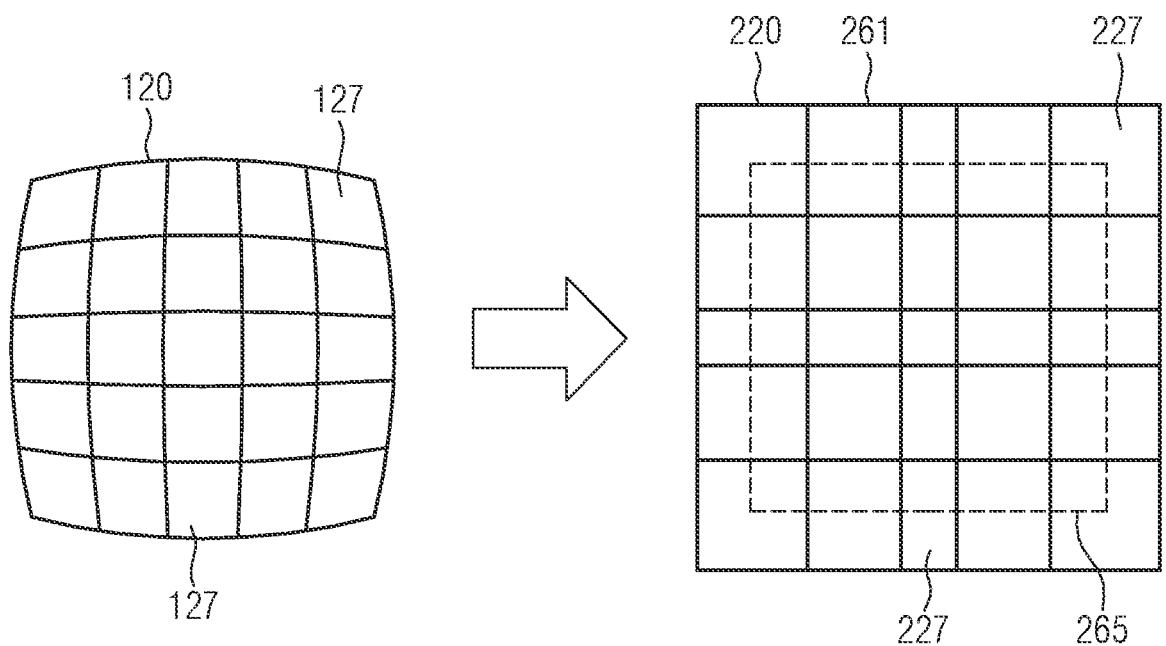
FIG. 2 shows a plan-view representation of a pixel array and an optical image of the pixel array, the pixel array comprising a barrel-shaped distorted structure and its optical image comprising a non-distorted structure.

FIG. 2 shows a plan view of a pixel array 120, as can be used for the light source 110 of the lighting device 100 of FIG. 1. FIG. 2 also shows a plan view of an optically imaged pixel array 220, which can be provided in the illumination region 261 by optically imaging the pixel array 120 into the illumination plane 260 by means of the imaging optics 115. The pixel array 120 comprises a quadrangular shape and comprises a plurality of light-emitting pixels 127 arranged next to one another. The pixels 127 are arranged in a matrix-like manner in the form of rows and columns. The pixels 127 can be driven separately from each other, and thereby operated individually and independently of each other for emitting the light radiation 250. This makes it possible in a flexible way to provide different light patterns in the illumination region 261.

The pixels 127 of the pixel array 120 shown in FIG. 2 comprise quadrangular shapes and curved pixel sides. There are different pixel shapes present, which deviate from a rectangular or square shape in different ways. Details regarding a possible size of the deviation are explained in further detail below with reference to FIG. 16. The appearance of the pixels 127 shown in FIG. 2 is caused by a distorted geometric structure of the pixel array 120. The pixel array 120 is designed in such a way that the pixel array 120 comprises outwardly curved sides and, starting from the center of the pixel array 120, light-emitting pixels 120 are present comprising shapes deviating increasingly from a rectangular or square shape towards the edge and hence in the direction of the curved edge sides and the corners of the pixel array 127. Towards the edge, the pixel array 120 comprises increasingly distorted, trapezoidal or diamond-like pixel shapes. A pixel 127 located in the center of the pixel array 120 can comprise only slightly curved pixel sides, and can deviate only slightly from a rectangular or square shape. Despite the distorted configuration, the pixels 127 of the pixel array 120 comprise matching or substantially matching lateral dimensions.

Between the light-emitting pixels 127 of the pixel array 120 shown in FIG. 2, there are non-light-emitting linear intermediate regions, which together form a line grid. Due to the distorted structure of the pixel array 120, the lines of the line grid comprise increasingly larger curvatures in the direction of the edge of the pixel array 120. The non-light-emitting intermediate regions can be relatively narrow, and after the optical imaging and thus in the optically imaged pixel array 220, they are not visible to an observer.

The distorted geometric structure evident in the pixel array 120 of FIG. 2 corresponds to a barrel-shaped optical distortion of a rectangular grid. In a corresponding way, the line grid formed by the non-light-emitting intermediate regions comprises the form of a grid which is subject to barrel-shaped distortion.

In coordination with the distorted pixel array 120, the lighting device 100 of FIG. 1 uses an imaging optics 115, which during the optical imaging effects an optical distortion counteracting the distorted structure of the pixel array 120. With regard to the barrel-shaped distorted structure of the pixel array 120, it is intended that the imaging optics 115 effects a pincushion-shaped distortion. In this way, optical images of the pixel array 120 and the light-emitting pixels 127 can be generated in the illumination region 261, which are at least less distorted compared to the pixel array 120 and to the pixels 127, and which therefore deviate at least less from a rectangular or square shape.

FIG. 2 illustrates a possible design according to which the optical distortion effected by the imaging optics 115 is directed against the distorted structure of the pixel array 120 in such a way that the distortion is completely cancelled out. As a result, the pixel array 220, which is optically imaged in the illumination region 261, comprises a rectangular or square shape. Similarly, optically imaged pixels 227 of the optically imaged pixel array 220, which are generated by the optical imaging of the light-emitting pixels 127 of the pixel array 120 in the illumination region 261, comprise a rectangular or square shape.

FIG. 2 also shows that the imaging optics 115 can be used to ensure that optically imaged pixels 227 are present in the illumination region 261 that comprise increasingly larger lateral dimensions from the center of the optically imaged pixel array 220 towards the edge, and hence towards the edge sides and the corners of the optically imaged pixel array 220. At the edge, therefore, the corner and edge pixels 227 are imaged in a significantly enlarged form. In this case, as shown in FIG. 2, in the center and along the diagonals of the rectangular imaged pixel array 220, square imaged pixels 227 may be present, and non-square rectangular imaged pixels 227 elsewhere.

Due to the separately controllable light-emitting pixels 127 of the pixel array 120, it is thus possible to provide different light patterns with a high spatial resolution in the central region of the illumination region 261. On the other hand, light patterns with a lower resolution can be generated further out from the center. Such a design, which can be realized with a relatively small number of light-emitting pixels 127 of the pixel array 120 and/or a small pixel surface area and hence an inexpensive design of the lighting device 100, satisfies the requirements for the application of the lighting device 100 as a headlamp.

The use of the imaging optics 115 that effects the pincushion-shaped distortion, as a result of which optically imaged pixels 227 with increasingly larger areal dimensions are situated towards the edge of the optically imaged pixel array 220, also enables the illumination region 261 to be relatively large. To illustrate this property, dashed lines in FIG. 2 indicate a reference region 265 which occupies a smaller surface area compared to the optically imaged pixel array 220. An illumination of the reference region 265 can be realized by imaging a conventional pixel array 121, shown in FIG. 3 in plan view, without distortion, i.e. using a non-distorting imaging optics, into the illumination plane 260.

Figure 3:
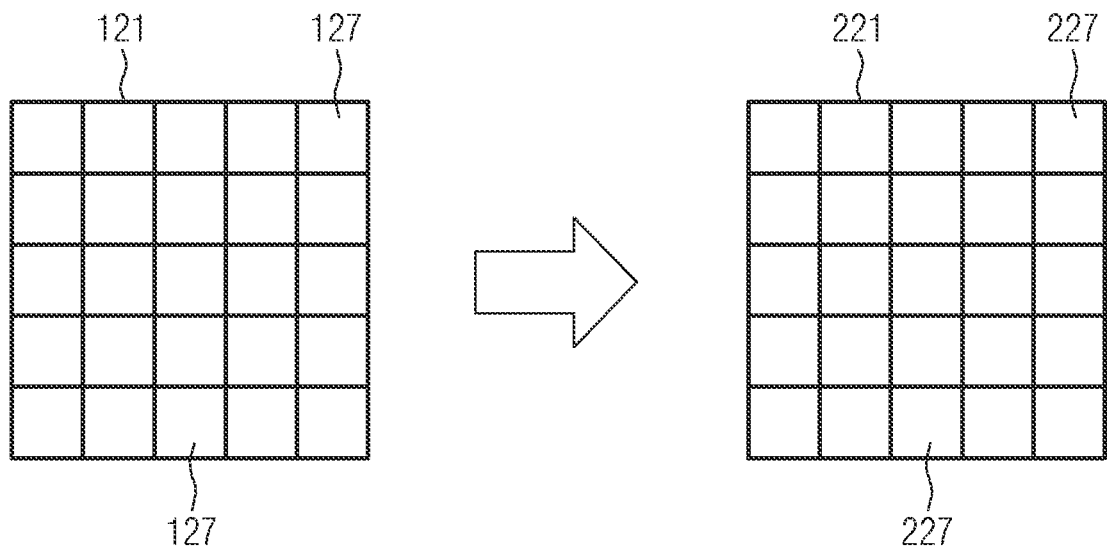
FIGS. 3 and 4 show further plan-view representations of a pixel array and different optical images of the pixel array.

The pixel array 121 shown in FIG. 3 comprises a rectangular or square contour, and comprises equal-sized square light-emitting pixels 127 with equal lateral dimensions. The dimensions of the pixels 127 of the pixel array 121 can correspond essentially to the dimensions of the pixels 127 of the distorted pixel array 120 of FIG. 2. FIG. 3 also shows a plan view of an optically imaged pixel array 221, which can be provided by the distortion-free optical imaging of the pixel array 121 into the illumination plane 260. The optically imaged pixel array 221 comprises a rectangular or square contour with equal-sized square pixels 227, corresponding to the pixel array 121. The outline of the imaged pixel array 221 corresponds to the reference region 265 shown in FIG. 2, which is smaller than the outline of the imaged pixel array 220.

Figure 4:
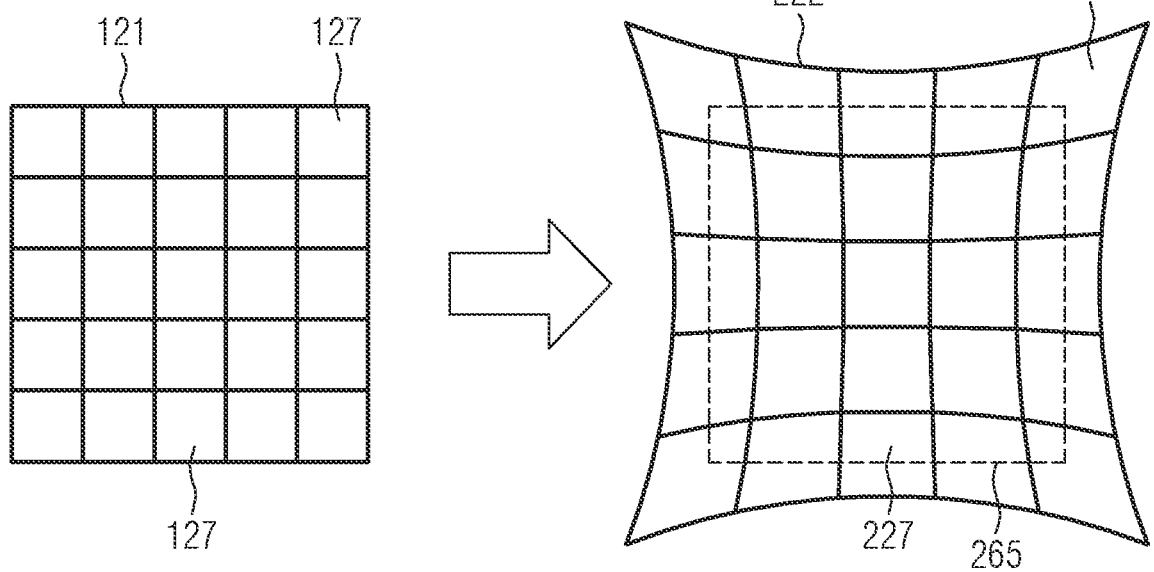

The conventional pixel array 121 shown in FIG. 3 can also be optically imaged by applying a distortion in order to provide a larger illumination region. Such a procedure is illustrated in FIG. 4. FIG. 4 shows, in addition to the pixel array 121, a plan view of an optically imaged pixel array 222, which can be provided by optically imaging the pixel array 121 into the illumination plane 260 by means of an imaging optics that applies a pincushion-shaped distortion. The pixel array 222, which is imaged in a larger size in comparison to the reference region 265, therefore comprises a structure with a strong pincushion-shaped distortion and optically imaged pixels 227 comprising distorted pixel shapes. In this case, corner pixels 227 are deformed to a rhomboid or diamond-like shape, and edge pixels 227 are correspondingly trapezoidally deformed. Such a characteristic may be undesirable for a headlamp application.

By contrast, the use of the distorted pixel array 120 shown in FIG. 2 makes it possible to provide an optically imaged pixel array 220 without, or as far as possible without, a distorted shape. In this context, the possibility exists, as already indicated above, that in the optical imaging of the pixel array 120 under the application of a pincushion-shaped distortion, the distorted structure of the pixel array 120 is not completely compensated. In this way, in contrast to FIG. 2, an imaged pixel array 220 and imaged pixels 227 can be provided which comprise shapes deviating slightly from a rectangular or square shape. These shapes can deviate less from a rectangular or square shape (not shown) compared to the pixel array 120 and the pixels 127.

Figure 5:
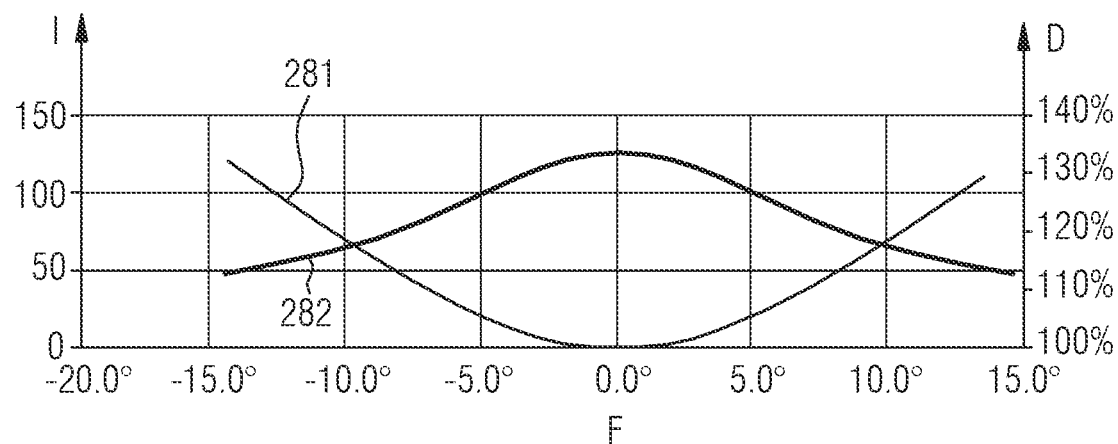
FIG. 5 shows a diagram with curves of an optical distortion and an illuminance as a function of an image angle.

In the case of the optically imaged pixel array 220, in which, as shown in FIG. 2, the imaged pixels 227 exhibit increasingly larger lateral dimensions towards the edge of the pixel array 220, a decreasing brightness can be provided from the center towards the edge. FIG. 5 shows a diagram created by a simulation to illustrate this property. The diagram shows a graph 281 of a distortion D and a graph 282 of an illuminance I, expressed in the unit lux, as a function of a diagonal image angle F, relative to an illuminated target region. The distortion D (graph 281) increases towards the edge of the target region and assumes a maximum of 130% at the edge. This is associated with an increase in the illuminated target region of approx. $(1.3)^2=1.69$. A decrease in the illuminance I (graph 282) also occurs towards the edge. This effect also satisfies the requirements for a headlamp application.

It should be noted that the light source 110 of the lighting device 100 shown in FIG. 1 can be realized with a distorted pixel array 120, which in contrast to the illustration in FIG. 2 comprises a different or larger number of light-emitting pixels 127. This includes, for example, a pixel array 120 with a three-digit or four-digit number of pixels 127. This applies in a similar manner to the design of a pixel array 125 described below.

Figure 6:
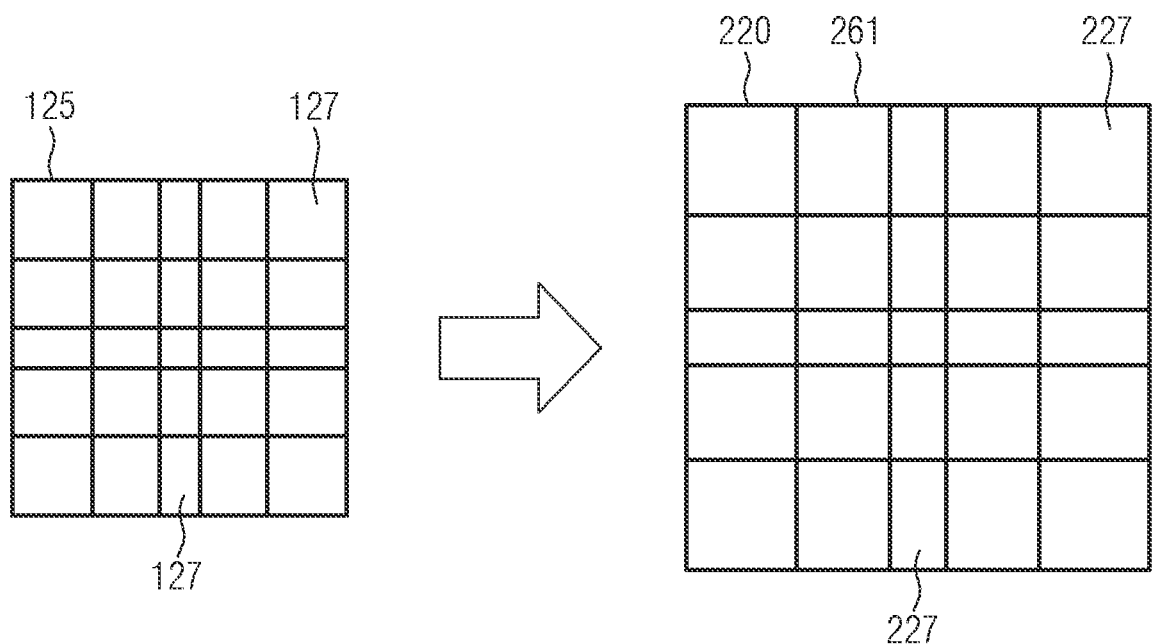
FIG. 6 shows a plan-view representation of a pixel array and an optical image of the pixel array, the pixel array comprising increasingly larger pixels towards the edge.

FIG. 6 shows a plan view of a further pixel array 125, as can also be used for the light source 110 of the lighting device 100 of FIG. 1. FIG. 6 also shows a plan view of an optically imaged pixel array 220, which can be provided in the illumination region 261 by optically imaging the pixel array 125 into the illumination plane 260 by means of the imaging optics 115. The pixel array 125 comprises a plurality of light-emitting pixels 127 arranged next to one another, which are arranged in a matrix-like manner in the form of rows and columns. The pixels 127 can be driven separately from one another for the emission of the light radiation 250, which allows different light patterns to be provided in the illumination region 261 in a flexible manner.

The pixel array 125 shown in FIG. 6 and its light-emitting pixels 127 comprise rectangular shapes. Furthermore, starting from the center of the pixel array 125, the pixels 127 exhibit increasingly larger lateral dimensions in the direction of the edge and hence towards the edge sides and the corners of the pixel array 125. FIG. 6 also shows that the pixel array 125 and also some of the light-emitting pixels 127 comprise square shapes. Square pixels 127 are therefore present in the center and along the diagonals of the pixel array 125, and non-square pixels 127 elsewhere.

The pixel array 120 shown in FIG. 6 also comprises nonlight-emitting linear intermediate regions between the pixels 127, which together form a line grid. The intermediate regions can be relatively narrow, and in the optically imaged pixel array 220 are not visible to an observer.

In coordination with the rectangular pixel array 125, the lighting device 100 of FIG. 1 is provided with an imaging optics 115, which does not cause distortion in the optical image. In this way, undistorted optical images of the pixel array 125 and the light-emitting pixels 127 can be generated in the illumination region 261. The optically imaged pixel array 220 shown in FIG. 6 therefore comprises a rectangular or square shape. Similarly, optically imaged pixels 227 of the optically imaged pixel array 220, which are generated in the illumination region 261 by the optical imaging of the light-emitting pixels 127 of the pixel array 125, comprise a rectangular or square shape. Comparable to the pixel array 125, in this case optically imaged pixels 227 are present in the illumination region that comprise increasingly larger lateral dimensions from the center of the optically imaged pixel array 220 towards the edge, and hence in the direction of the edge sides and the corners of the optically imaged pixel array 220. At the edge, therefore, corner and edge pixels 227 are imaged in a significantly enlarged form. In addition, in the center and along the diagonals of the imaged pixel array 220, square imaged pixels 227 may be present, and non-square rectangular imaged pixels 227 elsewhere.

Due to the separately controllable light-emitting pixels 127 of the pixel array 125 it is thereby possible to provide different light patterns with a high spatial resolution in the central region of the illumination region 261. On the other hand, light patterns with a lower resolution can be generated further out from the center. Such a design, which can be realized with a relatively small number of light-emitting pixels 127 of the pixel array 125 and/or a small pixel surface area and therefore an inexpensive design of the lighting device 100, satisfies the requirements for the application of the lighting device 100 as a headlamp. In addition, the illumination region 261 provided can be relatively large.

The pixelated light source 100 shown in FIG. 1 can be realized using a pixelated light-emitting semiconductor chip 130. Such a semiconductor chip 130 can form a pixel array 120, 125 of light-emitting pixels 127, as described above. Possible designs are explained in more detail below.

Figure 7:
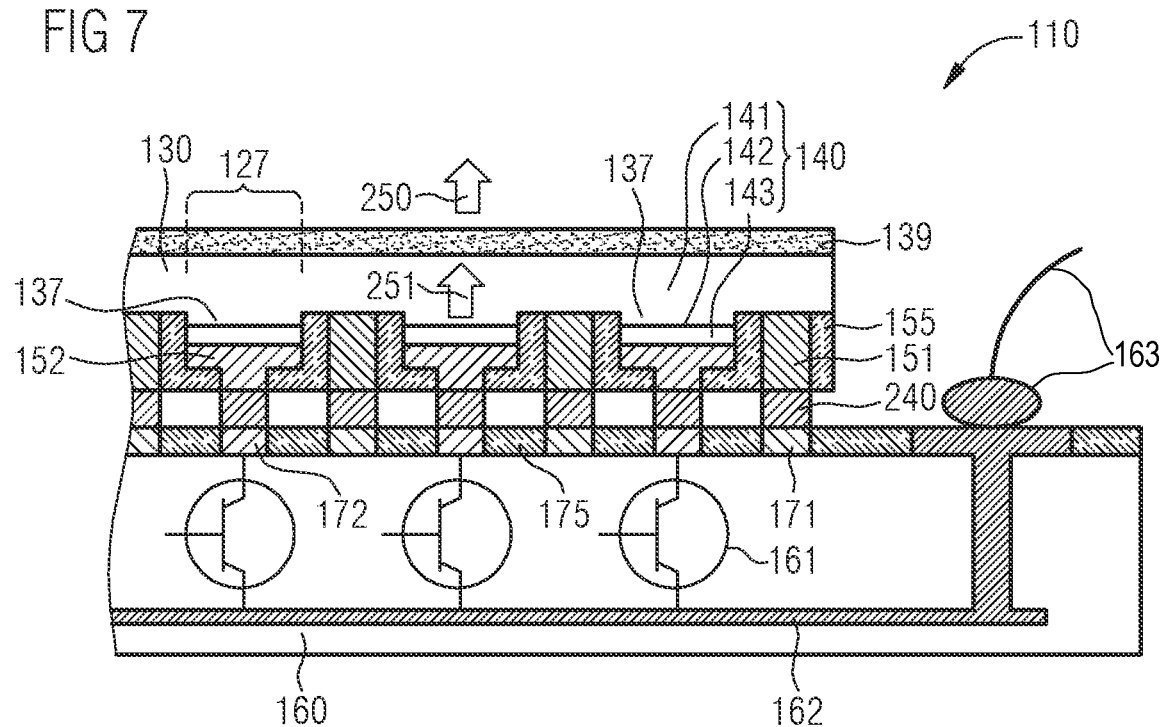
FIG. 7 shows a side view of a light source with an electronic semiconductor chip and a light-emitting semiconductor chip arranged thereon.

FIG. 7 shows a schematic side view of a light source 110, which comprises a pixelated light-emitting semiconductor chip 130 and an electronic semiconductor chip 160. The light-emitting semiconductor chip 130 is a pixelated LED chip (light emitting diode), which is configured in the form of a flip-chip. The light-emitting semiconductor chip 130 is located on the electronic semiconductor chip 160. The electronic semiconductor chip 160, which can also be referred to as a driver chip or IC chip (integrated circuit), is used to drive the light-emitting semiconductor chip 130 and thus the light-emitting pixels 127.

The light-emitting semiconductor chip 130 comprises a semiconductor layer sequence 140, which comprises a structured side facing the electronic semiconductor chip 160. Light-emitting regions 137 in the direction of the electronic semiconductor chip 160 are located at this position. The light-emitting regions 137 are separated by trenches, which together form a grid-shaped trench structure surrounding the regions 137.

As shown in FIG. 7, the semiconductor layer sequence 140 comprises a contiguous first semiconductor region 141 of a first conductor type and, in each of the light-emitting regions 137, a second semiconductor region 143 of a second conductor type, different from the first conductor type, and an active zone 142 located between the first semiconductor region 141 and the second semiconductor region 143. The first semiconductor region 141 can be n-conducting, and the second semiconductor regions 143 can be p-conducting. The active zones 142 are configured to generate a primary light radiation 251. The active zones 142 can be realized in the form of a p-n junction, a single quantum well structure, or a multiple quantum well structure.

The light-emitting semiconductor chip 130 also comprises a conversion layer 139 for radiation conversion, arranged on the semiconductor layer sequence 140 on a side facing away from the electronic semiconductor chip 160. The conversion layer 139 is designed to partially convert the primary light radiation 251, generated in operation by the active zones 142 of the light-emitting regions 137 and emitted in the direction of the conversion layer 139, into a secondary light radiation. The primary and secondary light radiation, which can be emitted by the conversion layer 139 together in the form of a superimposed mixed radiation 250, can be a blue and a yellow light radiation. In this way, a white light radiation 250 can be emitted by the light source 110.

With reference to the light-emitting pixels 127, each pixel 127 is formed by a light-emitting region 137 of the semiconductor layer sequence 140 and a region of the conversion layer 139 through which the primary light radiation 251 is transmitted during operation of the relevant light-emitting region 137. The geometric structure of a pixel array 120, 125 such as those described above, and the pixel shapes of the associated pixels 127, are determined by the lateral geometric shape of the light-emitting regions 137 of the semiconductor layer sequence 140.

The light-emitting semiconductor chip 130 also comprises a contact structure consisting of contact elements 151, 152 connected to the semiconductor layer sequence 140 on a side facing the electronic semiconductor chip 160, by means of which the semiconductor layer sequence 140 can be supplied with electrical energy for generating light. The contact structure comprises separate contact elements 152 and a contiguous contact element 151 with recesses, within which the contact elements 152 are arranged. The contiguous contact element 151 can operate as an anode, and the contact elements 152 can operate as cathodes. The contact elements 152 can comprise a stepped or T-shaped cross-section, as shown in FIG. 7. The contact elements 151, 152 can be at least partially metallic.

The contact element 151 is connected to the first semiconductor region 141 inside the trench structure separating the light-emitting regions 137. The other contact elements 152 are each connected to one of the second semiconductor regions 143. In this way, the light-emitting regions 137 and hence the light-emitting pixels 127 can be driven independently of each other for light generation. To increase reliability, on the side facing the electronic semiconductor chip 160 the light-emitting semiconductor chip 130 also comprises an insulation 155 separating the contact elements 151, 152. The insulation 155 can comprise an electrically insulating material such as polyimide, silicon nitride or silicon oxide.

The electronic semiconductor chip 160, on which the pixelated light-emitting semiconductor chip 130 is located, is configured to drive the light-emitting semiconductor chip 130. The electronic semiconductor chip 160, as shown in FIG. 7, comprises a contact structure consisting of contact elements 171, 172 on the side facing the light-emitting semiconductor chip 130, which is matched to the contact structure of the light-emitting semiconductor chip 130. The contact structure comprises separate contact elements 172 and a contiguous contact element 171 with recesses, within which the contact elements 172 are arranged. The contact elements 171, 172 can be at least partially metallic.

The contiguous contact element 171, which is electrically connected to the contact element 151 of the light-emitting semiconductor chip 130, can operate as an anode. The other contact elements 172, which are electrically connected to the contact elements 152 of the light-emitting semiconductor chip 130, can operate as cathodes. The electrical connection between the respective contact elements 151, 171 and 152, 172 is produced by means of a solder 240. To increase reliability, on the side facing the light-emitting semiconductor chip 130 the electronic semiconductor chip 160 also comprises an insulation 175 separating the contact elements 171, 172. In the same way as the insulation 155 of the light-emitting semiconductor chip 130, the insulation 175 can contain an electrically insulating material such as polyimide, silicon nitride or silicon oxide.

The electronic semiconductor chip 160 additionally comprises a plurality of switches 161, as shown in FIG. 7. The switches 161 can be implemented in the form of transistors.

The switches 161 are connected to the contact elements 172 and to a conductor structure 162 that can be contacted externally. The other contact element 171 can also be contacted externally, or be connected to a conductor structure of the electronic semiconductor chip 160 that can be contacted externally (not shown). As indicated in FIG. 7 with regard to the conductor structure 162, the electronic semiconductor chip 160 can be contacted by means of bond wires 163, for example, and thus connected to a power source. In the operation of the light source 100, by selective switching of the switches 161 of the electronic semiconductor chip 160, single, multiple or all of the light-emitting regions 137, and thus pixels 127 of the light-emitting semiconductor chip 130, can be energized and thereby driven for light emission. In contrast to the schematic representation in FIG. 7, the electronic semiconductor chip 160 can comprise further circuit components, not shown.

With reference to the light source 100 shown in FIG. 7 and constructed from the two semiconductor chips 130, 160, an offset may be present between the contact structures of the semiconductor chips 130, 160. This is discussed in more detail below.

Figure 8:
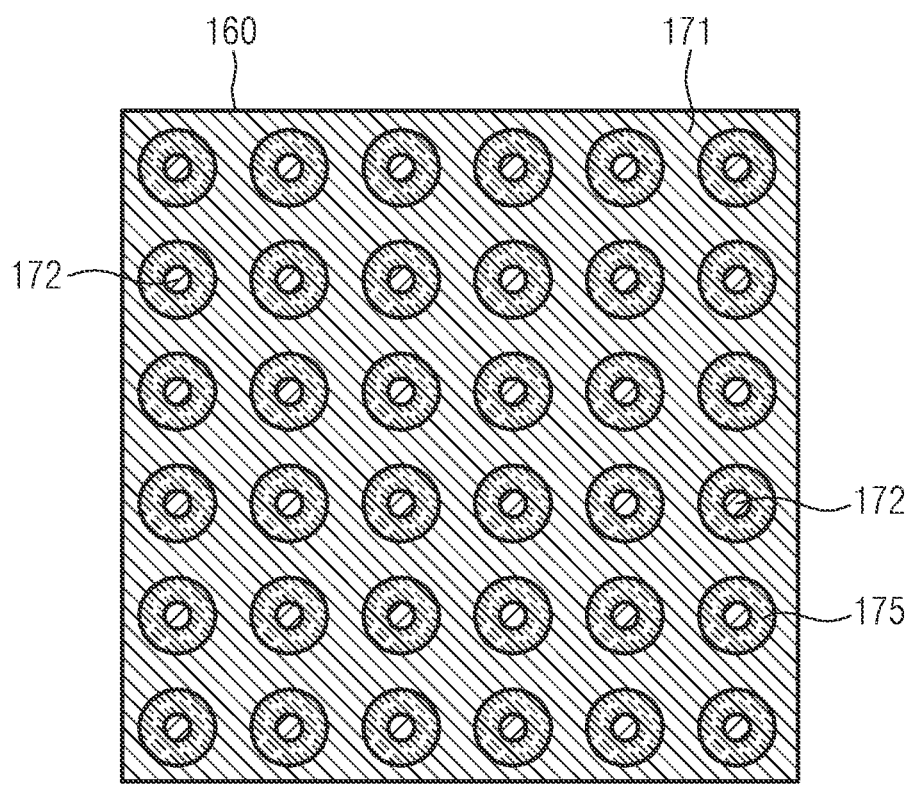
FIG. 8 shows a plan-view representation of an electronic semiconductor chip illustrating a contact structure.

FIG. 8 shows a plan view of an electronic semiconductor chip 160, on the basis of which a possible design of a contact structure becomes clear. The contact structure comprises a contiguous contact element 171 with circular recesses, within which contact elements 172 with a circular outline are arranged. The recesses of the contact element 171 and the contact elements 172 are arranged in a regular periodic grid.

Viewed from above, the contact structure of an associated pixelated light-emitting semiconductor chip 130 can comprise a similar appearance to the contact structure shown in FIG. 8 and can comprise a contiguous contact element 151 with, for example, circular recesses, and contact elements 152 with, for example, a circular outline. However, contrary to FIG. 8, the contact structure of the light-emitting semiconductor chip 130 can comprise a shape in which the recesses of the contact element 151 and the contact elements 152 are not arranged in a regular grid. Instead, the contact structure can be configured according to the respective pixel array 120, 125 consisting of pixels 127, in which the recesses of the contact element 151 and the contact elements 152 are arranged corresponding to the pixels 127 or center points of the pixels 127, and thus at irregular intervals. In this way, a position-dependent lateral offset can occur between the contact structures of the two semiconductor chips 130, 160.

Figure 9:
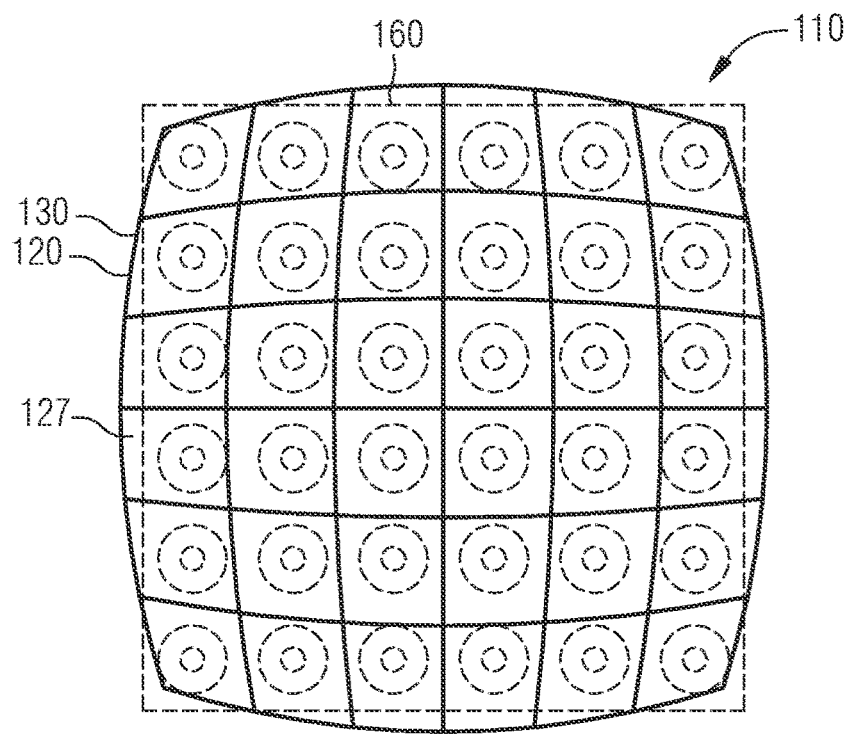
FIGS. 9 and 10 show plan-view representations of light sources, illustrating contact structures of electronic semiconductor chips and pixel arrays of light-emitting semiconductor chips.
Figure 10:
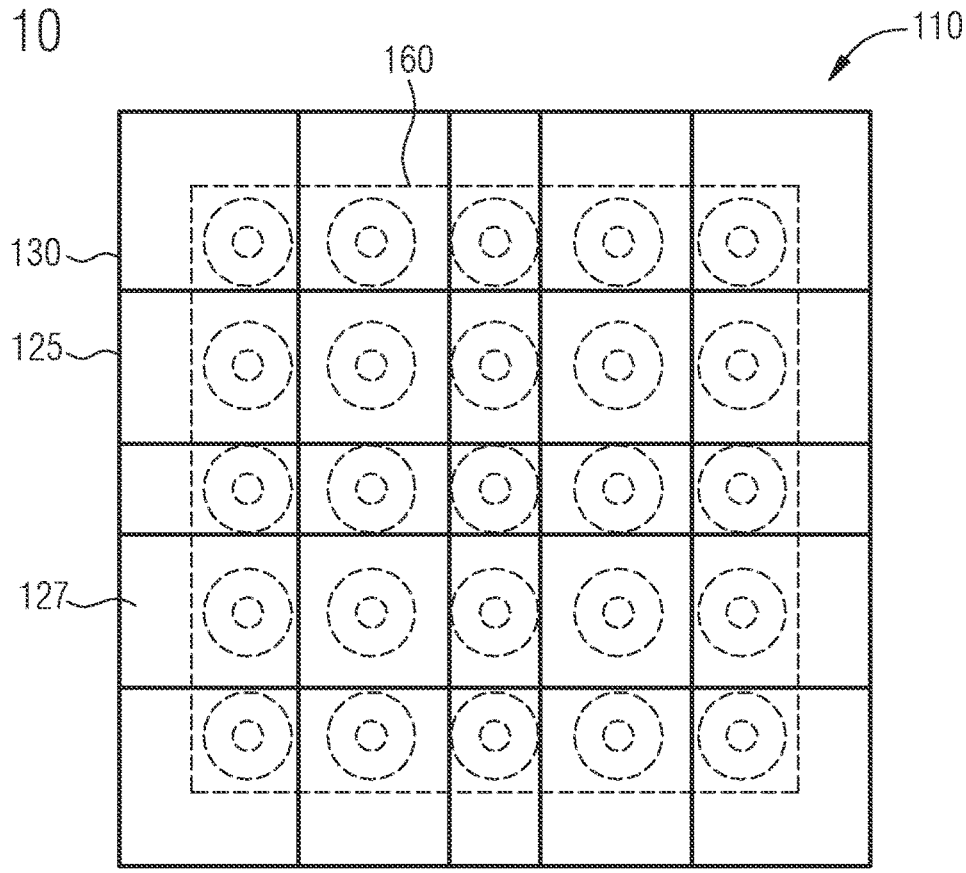

For further illustration, FIGS. 9 and 10 show plan views of a light source 110 in which the regular contact structure of an electronic semiconductor chip 160, with a configuration according to FIG. 8, and a pixel array 120, 125 consisting of pixels 127 of a light-emitting semiconductor chip 130 are shown. It is clear that an offset can exist between the contact structure of the electronic semiconductor chip 160 and the pixels 127 of the light-emitting semiconductor chip 130, and hence also the contact structure of the light-emitting semiconductor chip 130. The offset can increase in size towards the edge of the respective pixel array 120, 125. There can be no, or a smaller, offset in the middle of the two semiconductor chips 130, 160.

Figure 11:
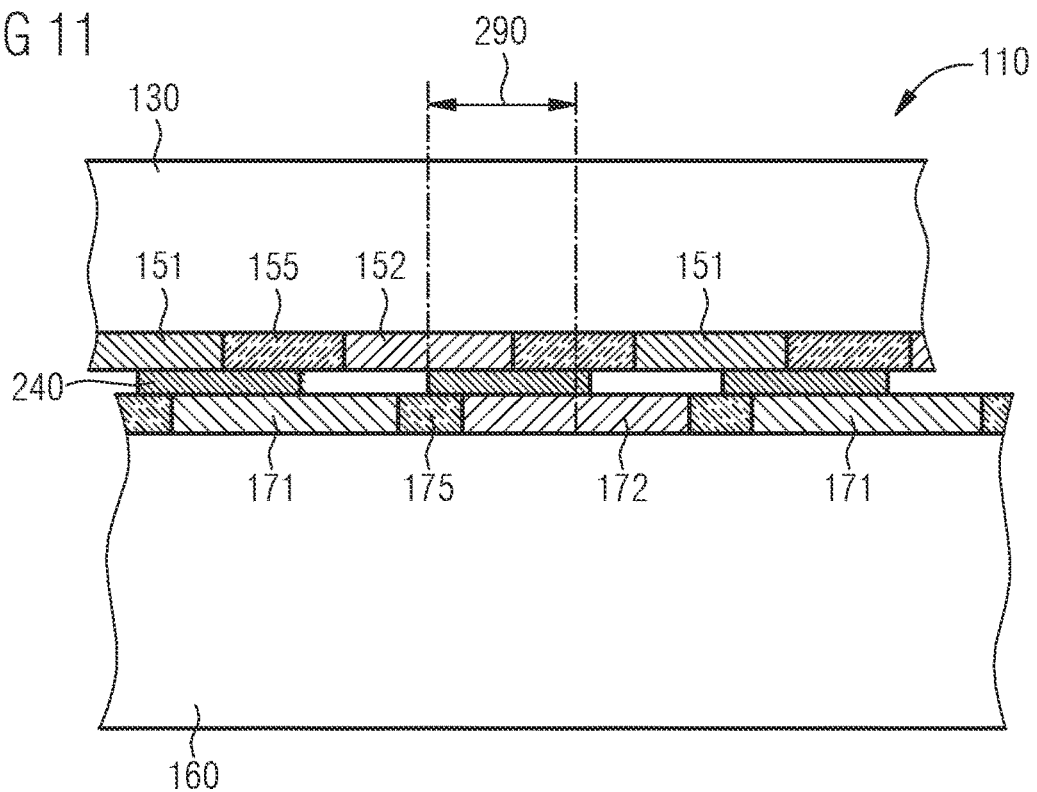
FIG. 11 shows a side view of a light source with an electronic semiconductor chip and a light-emitting semiconductor chip arranged thereon, illustrating an electrical connection of contact structures of the semiconductor chips.

Despite the existence of an offset, it is possible to establish a reliable electrical connection between an electronic semiconductor chip 160 and a pixelated light-emitting semiconductor chip 130. To illustrate this, FIG. 11 shows a side view of a light source 110 comprising an electronic semiconductor chip 160 and a light-emitting semiconductor chip 130 arranged thereon and electrically connected thereto using a solder 240. In the detail shown, an offset 290 is present between the contact structures of the two semiconductor chips 130, 160. For reasons of clarity, FIG. 11 shows a simplified representation of the contact structure of the light-emitting semiconductor chip 130, which differs from FIG. 7.

This applies in a similar manner to FIG. 12 described below.

Alternatively, it is possible to compensate for the presence of an offset by designing a contact structure with one or more redistribution layers that are matched to it. A possible configuration is illustrated in FIG. 12, which shows a further side view of a light source 110 comprising an electronic semiconductor chip 160 and a light-emitting semiconductor chip 130 arranged thereon and electrically connected thereto using a solder 240. The contact structure of the electronic semiconductor chip 160 comprises contact elements 171, 172, which are composed of a plurality of partial sections 181, 182, 183 arranged on top of one another and positioned offset relative to each other in the detail shown. The contact sections 182, 183 are components of two redistribution layers (RDL), with which an offset 290 between the contact elements 151, 152 of the light-emitting semiconductor chip 130 and the lowest layer of contact sections 181 of the electronic semiconductor chip 160 is compensated.

Figure 12:
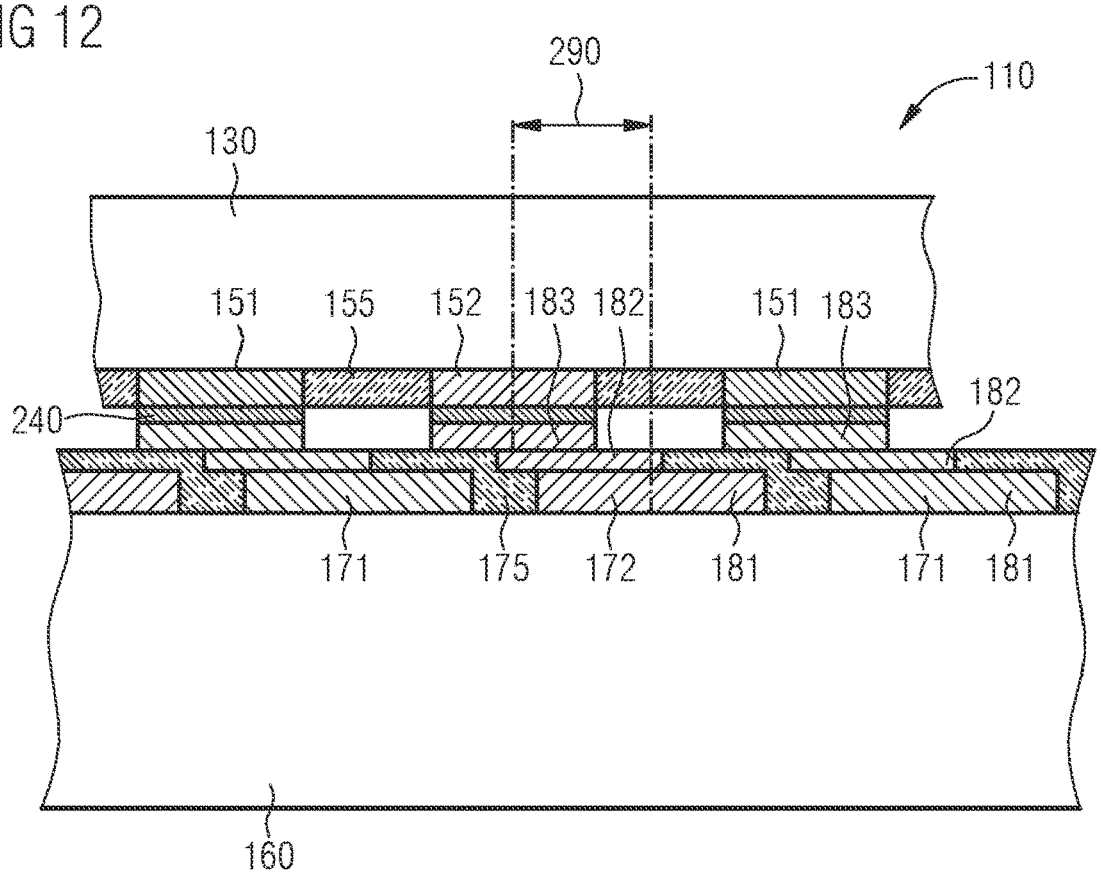
FIG. 12 shows a side view of a light source with an electronic semiconductor chip and a light-emitting semiconductor chip arranged thereon, illustrating an electrical connection of contact structures of the semiconductor chips, and wherein the electronic semiconductor chip comprises redistribution layers.

In contrast to FIG. 12, a design of an electronic semiconductor chip 160 with a different number of redistribution layers can be provided, including with only one redistribution layer. In addition, to compensate for an offset, instead of an electronic semiconductor chip 160 a pixelated light-emitting semiconductor chip 130 can be equipped with one or more redistribution layers (not shown in each case).

Figure 13:
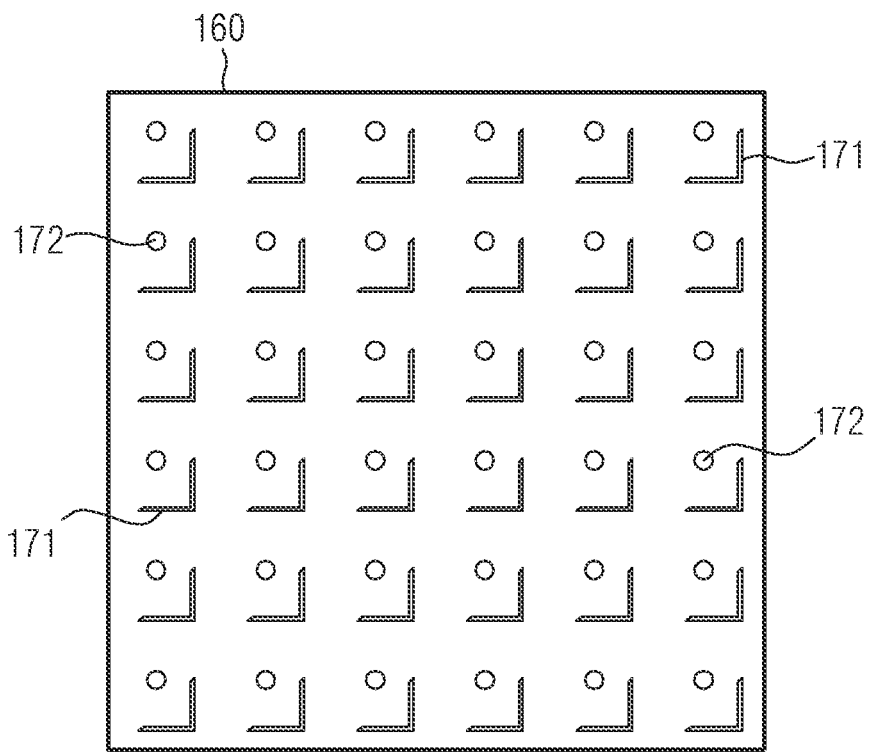
FIG. 13 shows a plan-view representation of an electronic semiconductor chip illustrating a contact structure.

FIG. 13 shows a plan view of an electronic semiconductor chip 160, on the basis of which a further possible design of a contact structure becomes clear. The contact structure comprises separate L-shaped contact elements 171 (instead of a contiguous contact element 171) and separate circular contact elements 172. The contact elements 171 can operate as anodes, and the contact elements 172 can operate as cathodes. The contact elements 171, 172 are arranged in a regular periodic grid.

The contact structure of an associated pixelated light-emitting semiconductor chip 130, viewed from above, can comprise a similar appearance to the contact structure shown in FIG. 13 and comprise separate L-shaped and separate circular contact elements connected to semiconductor regions 141, 143 of a semiconductor layer sequence 140 of the light-emitting semiconductor chip 130 (not shown). However, contrary to FIG. 13, the contact structure of the light-emitting semiconductor chip 130 can comprise a shape in which such contact elements are not arranged in a regular grid. Instead, the contact structure can be configured according to the respective pixel array 120, 125 consisting of pixels 127, in which the contact elements are arranged corresponding to the pixels 127 or center points of the pixels 127, and thus at irregular intervals. As a result, a position-dependent lateral offset can be present between the contact structures of the two semiconductor chips 130, 160.

Figure 14:
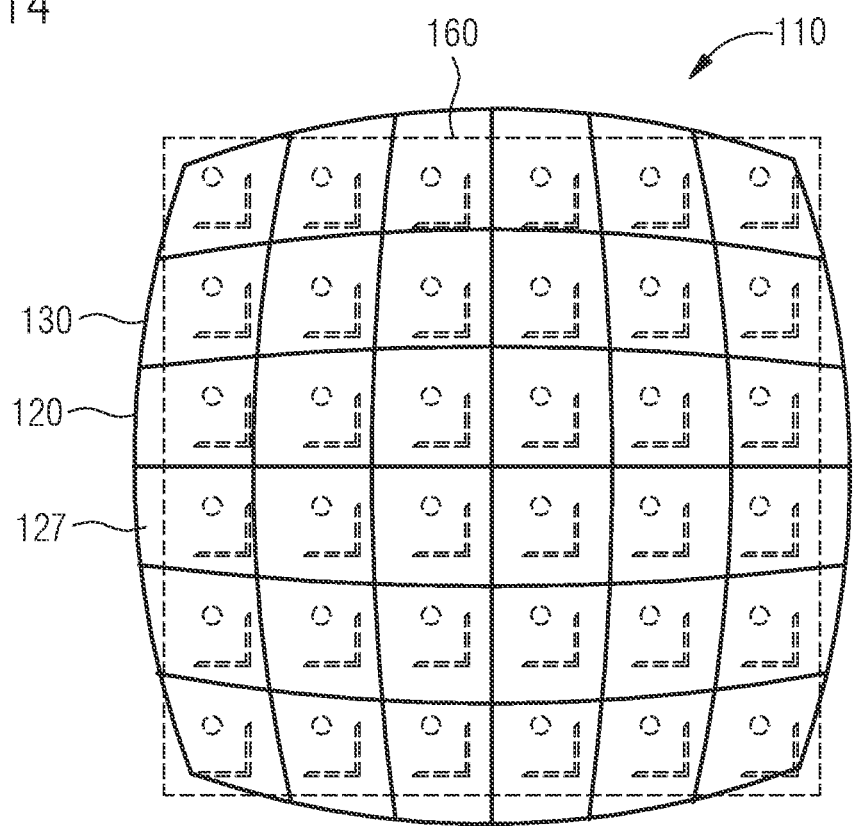
FIGS. 14 and 15 show further plan-view representations of light sources, illustrating contact structures of electronic semiconductor chips and pixel arrays of light-emitting semiconductor chips.
Figure 15:
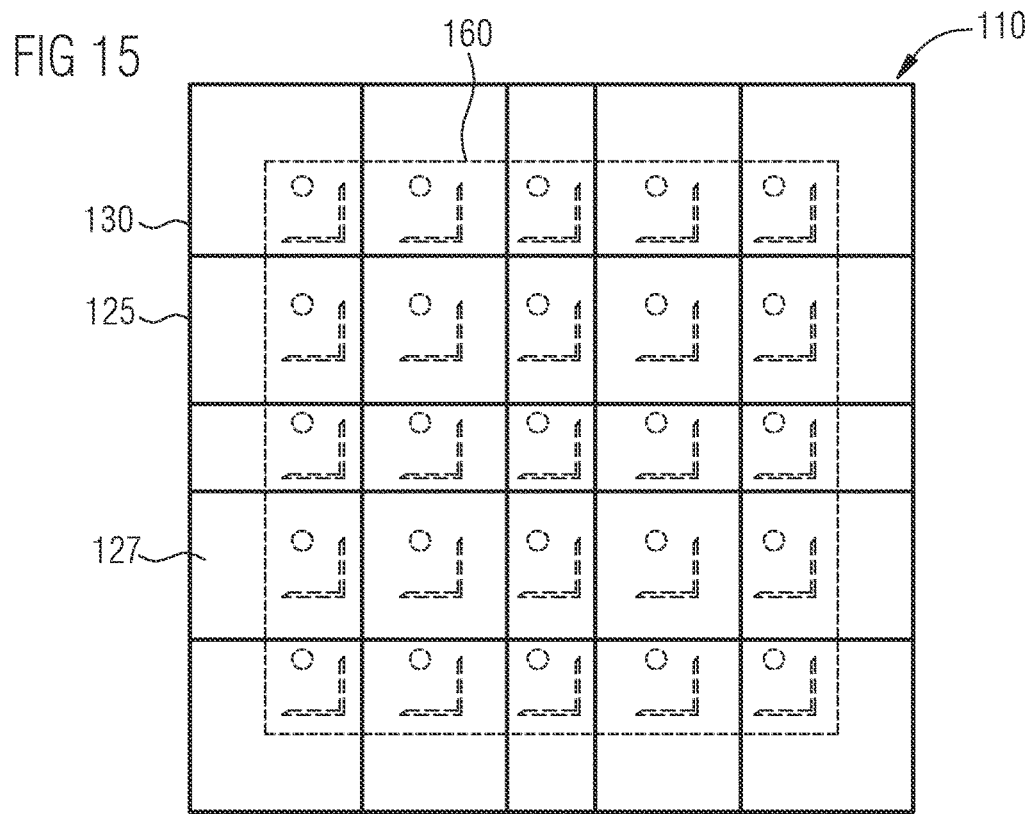

For further illustration, FIGS. 14 and 15 show plan views of a light source 110, in which the regular contact structure of an electronic semiconductor chip 160, with a configuration according to FIG. 13, and a pixel array 120, 125 consisting of pixels 127 of a light-emitting semiconductor chip 130 are shown. It is now clear that an offset may exist between the contact structure of the electronic semiconductor chip 160 and the pixels 127 of the light-emitting semiconductor chip 130, and hence also the contact structure of the light-emitting semiconductor chip 130, which can be increasingly larger towards the edge of the respective pixel array 120, 125. In the area of the center of the two semiconductor chips 130, 160, there can be no, or only a smaller, offset. Even with such a configuration, it is possible to produce a reliable electrical connection between the semiconductor chips 130, 160 in spite of an offset, as explained by reference to FIG. 11. Alternatively, at least one redistribution layer can be provided for one of the two contact structures, as was explained by reference to FIG. 12.

With regard to the deviation from a rectangular shape, as is the case in the distorted pixel array 120 shown in FIG. 2, the following further details can be taken into account. For the pixel array 120 and its light-emitting pixels 127, maximal approximate rectangular reference areas can be considered in each case, which in plan view are comprised by the pixel array 120 and the relevant pixels 127 and which extend up to the edge of the pixel array 120 and the pixels 127. The pixels 127 present at the edge or in the corners of the pixel array 120 deviate the most from a rectangular shape. Similarly, such pixels 127 may have the largest proportional surface area differences with respect to the corresponding rectangular reference areas.

Figure 16:
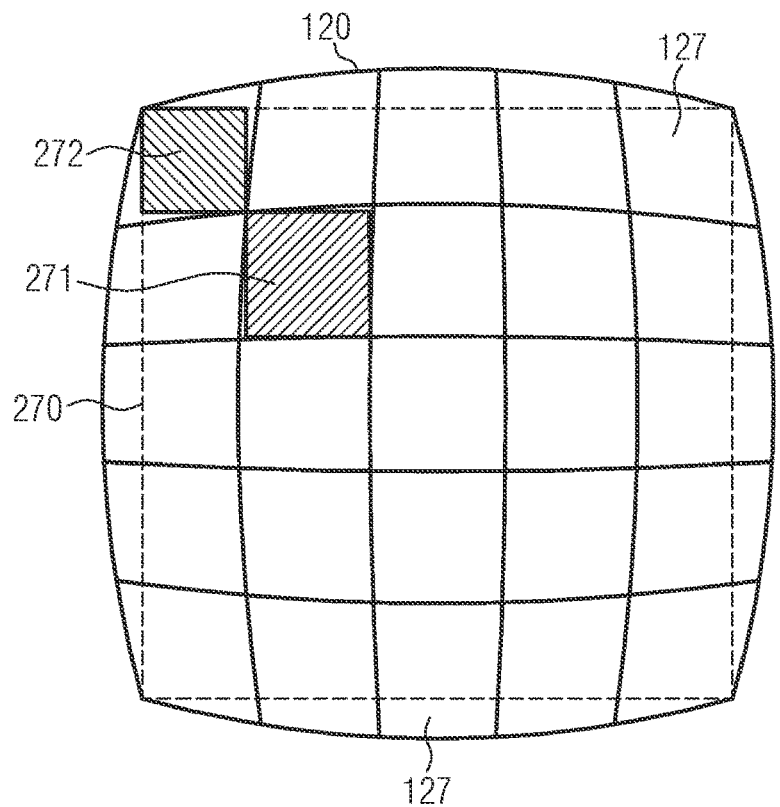
FIG. 16 shows a plan-view representation of a pixel array comprising a distorted structure, additionally illustrating approximate rectangular reference areas.

For further clarification, FIG. 16 shows the distorted pixel array 120, a maximum approximate rectangular reference area 270 corresponding to the pixel array 120 shown by dashed lines, and maximum approximate rectangular reference areas 271, 272 corresponding to two pixels 127, shown by hatched areas. The reference areas 271, 272 clearly show that there is a greater area difference between the corner pixel 127 and its reference area 272 than between the pixel 127 located further in and its reference area 271.

The distorted pixel array 120 can be designed in such a way that the surface areas of the pixel array 120 and of the light-emitting pixels 127 are larger than the area contents of the respective approximate rectangular reference areas by no more than a specified percentage deviation value. For example, the deviation value can be 30%. A deviation value of 10% or 100%, for example, is also possible.

With regard to the distorted pixel array 120, the alternative possibility explained above exists, namely that in the optical imaging of the pixel array 120, under the action of a pincushion-shaped distortion the distorted structure of the pixel array 120 is not completely compensated and, as a result, contrary to FIG. 2, an imaged pixel array 220 and imaged pixels 227 are provided, which comprise shapes deviating from a rectangular shape. These shapes may deviate less from a rectangular or square shape compared to the pixel array 120 and the pixels 127. This characteristic can be explained in a similar way using reference areas. For this purpose, maximal approximate rectangular reference areas can also be considered for each of the optically imaged pixel array 220 and the optically imaged pixels 227 that comprise a shape deviating from a rectangular shape, which areas in plan view are comprised by the imaged pixel array 220 and the relevant imaged pixels 227, and which extend up to the edge of the imaged pixel array 220 and the imaged pixels 227. In this case, the proportional surface area differences between the imaged pixel array 220 or the imaged pixels 227 and their respective associated reference areas may be less than the proportional area differences between the pixel array 120 or the pixels 127 and the respective associated reference areas (not shown in either case).

In addition to the embodiments described above and depicted in the figures, further embodiments can be envisaged, which may comprise further variations and/or combinations of features.

Variations may consist, for example, of providing other shapes, viewed from above, for a pixel array and/or pixels, instead of the shapes shown in the figures. With reference to the pixel array 120 shown in FIG. 2, for example, a variation is conceivable in which instead of the distorted shape deviating from a square, a distorted shape deviating from a non-square rectangle is applied. In the same way, an optically imaged pixel array 220 can comprise a non-square rectangular shape.

The same applies to the pixel array 125 shown in FIG. 6. In this case, for example, a non-square rectangular shape can be considered instead of the square shape. Such a shape can therefore also be present in an optically imaged pixel array 220.

Variations are also possible with respect to an imaging optics 115. In this sense, for example, with regard to the pixel array 120 shown in FIG. 2, it is conceivable to use an imaging optics 115 which images the light-emitting pixels 127 in the illumination region 261 in such a way that imaged pixels 227 shown do not comprise increasingly larger lateral dimensions towards the edge, but instead that there are imaged pixels 227 with matching or substantially matching dimensions.

With reference to the rectangular pixel array 125 shown in FIG. 6, there is an alternative possibility of using an imaging optics 115 which effects a slight distortion instead of a distortion-free imaging optics 115. In this way, the optical images of the rectangular pixel array 125 and the rectangular light-emitting pixels 127, which can be generated in the illumination region 261 using the imaging optics 115, can comprise shapes deviating slightly from a rectangular shape. This characteristic can also be defined using reference areas. For this purpose, maximal approximate rectangular reference areas can be considered for each of the optically imaged pixel array 220 and the optically imaged pixels 227 that comprise a shape deviating from a rectangular shape, which areas in plan view are comprised by the imaged pixel array 220 and the relevant imaged pixels 227, and which extend up to the edge of the imaged pixel array 220 and the imaged pixels 227. The area contents of the imaged pixel array 220 and of the imaged pixels 227 can be larger than the area contents of the respective reference areas by no more than a specified percentage deviation value. For example, the deviation value can be 30%. A deviation value of 10% or 100%, for example, is also possible (neither shown).

Although the invention has been illustrated and described in greater detail by means of preferred exemplary embodiments, the invention is not restricted by the examples disclosed and other variations can be derived therefrom by the person skilled in the art without departing from the scope of protection of the invention.

LIST OF REFERENCE SIGNS 100 lighting device
110 light source
115 imaging optics
120 pixel array
121 pixel array
125 pixel array
127 pixel
130 light-emitting semiconductor chip
137 light-emitting region
139 conversion layer
140 semiconductor layer sequence
141 semiconductor region
142 active zone
143 semiconductor region
151 contact element
152 contact element
155 insulation
160 electronic semiconductor chip
161 switch
162 conductor structure
163 bond wire
171 contact element
172 contact element
175 insulation
181 partial section
182 partial section
183 partial section
220 imaged pixel array
221 imaged pixel array
222 imaged pixel array
227 imaged pixel
240 solder
250 light radiation
251 primary light radiation
260 illumination plane
261 illumination region
265 reference region
270 reference area
271 reference area
272 reference area
281 curve
282 curve
290 offset
D distortion
F diagonal image angle
I illuminance

The invention claimed is:

1. A lighting device comprising a pixel array of light-emitting pixels arranged next to one another, the pixel array comprising light-emitting pixels with different pixel shapes,
wherein the pixel array and the light-emitting pixels comprise quadrangular shapes,
and wherein the pixel array comprises a distorted structure in such a manner that the pixel array comprises outwardly curved sides and, towards the edge of the pixel array, light-emitting pixels comprising shapes increasingly deviating from a rectangular shape are present.

2. The lighting device according to claim 1,
wherein the distorted structure corresponds to a barrel-shaped distortion of a rectangular grid.

3. The lighting device according to claim 1,
comprising an imaging optics arranged downstream of the pixel array for optically imaging a light radiation generated by means of the pixel array,
wherein an optical distortion counteracting the distorted structure can be effected by means of the imaging optics so that optical images of the pixel array and of the light-emitting pixels can be generated in an illumination region, which images comprise rectangular shapes or which, in contrast to the pixel array and to the light-emitting pixels, comprise shapes deviating to a lesser extent from a rectangular shape.

4. The lighting device according to claim 3,
wherein a pincushion-shaped distortion can be effected by means of the imaging optics.

5. The lighting device according to claim 3,
wherein the imaging optics is configured in such a way that optical images of the light-emitting pixels are present in the illumination region that comprise increasingly larger dimensions towards the edge of the optically imaged pixel array.

6. The lighting device according to claim 1,
wherein the light-emitting pixels of the pixel array can be driven separately from each other.

7. The lighting device according to claim 1,
comprising a pixelated light-emitting semiconductor chip, by means of which the pixel array of the light-emitting pixels is formed.

8. The lighting device according to claim 7,
comprising an electronic semiconductor chip on which the pixelated light-emitting semiconductor chip is arranged,
wherein the electronic semiconductor chip is configured to drive the light-emitting pixels of the pixel array.

9. The lighting device according to claim 8,
wherein the pixelated light-emitting semiconductor chip and the electronic semiconductor chip comprise contact structures which are electrically connected to each other,
and wherein the contact structure of the pixelated light-emitting semiconductor chip and/or the contact structure of the electronic semiconductor chip comprises at least one redistribution layer.

10. A lighting device comprising a pixel array of light-emitting pixels arranged next to one another, the pixel array comprising light-emitting pixels with different pixel shapes,
wherein the pixel array and the light-emitting pixels comprise quadrangular shapes,
wherein the pixel array comprises a shape deviating from a rectangular shape and comprises light-emitting pixels which comprise shapes deviating from a rectangular shape, wherein the lighting device comprises an imaging optics arranged downstream of the pixel array for optically imaging a light radiation generated by means of the pixel array, and wherein an optical distortion can be effected by means of the imaging optics so that optical images of the pixel array and of the light-emitting pixels can be generated in an illumination region, which images comprise rectangular shapes or which, in contrast to the pixel array and to the light-emitting pixels, comprise shapes deviating to a lesser extent from a rectangular shape.

11. The lighting device according to claim 10, wherein the imaging optics is configured in such a way that optical images of the light-emitting pixels are present in the illumination region that comprise increasingly larger lateral dimensions from the center of the optically imaged pixel array towards the edge of the optically imaged pixel array.

12. The lighting device according to claim 10, wherein the pixel array comprises a distorted structure in such a manner that the pixel array comprises outwardly curved sides and, starting from the center of the pixel array towards the edge of the pixel array, light-emitting pixels comprising shapes increasingly deviating from a rectangular shape are present.

13. The lighting device according to claim 12, wherein the distorted structure of the pixel array corresponds to a barrel-shaped distortion of a rectangular grid, and wherein a pincushion-shaped optical distortion counteracting the distorted structure can be effected by means of the imaging optics.

14. A lighting device comprising a pixel array of light-emitting pixels arranged next to one another, the pixel array comprising light-emitting pixels with different pixel shapes, wherein the pixel array and the light-emitting pixels comprise rectangular shapes, and wherein the light-emitting pixels comprise increasingly larger dimensions towards the edge of the pixel array.

15. The lighting device according to claim 14, comprising an imaging optics arranged downstream of the pixel array for optically imaging a light radiation generated by means of the pixel array, wherein optical images of the pixel array and of the light-emitting pixels can be generated in an illumination region by means of the imaging optics in such a way that optical images of the light-emitting pixels are present comprising increasingly larger dimensions towards the edge of the optically imaged pixel array.

16. The lighting device according to claim 15, wherein the optical images of the pixel array and of the light-emitting pixels that can be generated in the illumination region by means of the imaging optics comprise rectangular shapes.

17. The lighting device according to claim 15, wherein the imaging optics is configured to optically image the pixel array in a distortion-free manner.

18. The lighting device according to claim 14, wherein the increasingly larger dimensions of the light-emitting pixels are present starting from the center of the pixel array towards the edge sides and the corners of the pixel array.

19. The lighting device according to claim 14, wherein square light-emitting pixels are present in the center and along diagonals of the pixel array, and wherein the remaining light-emitting pixels of the pixel array are non-square rectangular pixels.

* * * * *